(12) United States Patent
Kang

(10) Patent No.: US 7,301,188 B2
(45) Date of Patent: Nov. 27, 2007

(54) CMOS IMAGE SENSOR AND METHOD OF MANUFACTURING THE SAME

(75) Inventor: Hwa-Yong Kang, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 54 days.

(21) Appl. No.: 11/148,061

(22) Filed: Jun. 8, 2005

(65) Prior Publication Data

US 2006/0081890 A1    Apr. 20, 2006

(30) Foreign Application Priority Data

Oct. 18, 2004    (KR)    ................ 10-2004-0083028

(51) Int. Cl.
*H01L 31/062* (2006.01)

(52) U.S. Cl. ............... 257/292; 257/233; 257/E23.115; 257/E23.13

(58) Field of Classification Search ................ 257/233, 257/E27.133, 292, E23.115
See application file for complete search history.

(56) References Cited

U.S. PATENT DOCUMENTS

| | | | |
|---|---|---|---|
| 6,489,643 B1 * | 12/2002 | Lee et al. | ................ 257/292 |
| 2004/0238908 A1 * | 12/2004 | Hashimoto | ................ 257/432 |
| 2005/0151218 A1 * | 7/2005 | Mouli | ................ 257/446 |

* cited by examiner

*Primary Examiner*—Jerome Jackson
*Assistant Examiner*—Mohammad Timor Karimy
(74) *Attorney, Agent, or Firm*—Cha & Reiter, LLC

(57) ABSTRACT

An image sensor includes a substrate with an epitaxial layer deposited thereon, a plurality of photodiodes buried in the epitaxial layer, and a plurality of field oxide films interposed between the photodiodes for insulating the photodiodes. Each of the field oxide films includes a trench formed on the epitaxial layer, a first oxide layer deposited on an inside of the trench, a reflective layer deposited on the first oxide film for reflecting incident light to a side of the photodiode, and a second oxide layer formed on the reflective layer.

18 Claims, 4 Drawing Sheets

CMOS IMAGE SENSOR AND METHOD OF MANUFACTURING THE SAME

CLAIM OF PRIORITY

This application claims priority to an application entitled "CMOS image sensor and method of manufacturing the same," filed in the Korean Intellectual Property Office on Oct. 18, 2004 and assigned Serial No. 2004-83028, the contents of which are hereby incorporated by reference.

BACKGROUND OF THE INVENTION

1. Field of the Invention

The present invention relates to an image sensor, and more particularly, to a CMOS image sensor and a method of manufacturing the same.

2. Description of the Related Art

A CMOS image sensor is a semiconductor device with a plurality of photodiodes integrated therein, and each of the photodiodes is a sensor for converting incident light into an electrical signal to detect an image of a target object. The CMOS image sensors have been developed to be mounted to portable, hand-held, personal compact devices such as camera phones and digital cameras, so there is limitation to their size.

In a common image sensor, the smallest unit to detect the light is a pixel. The image sensor includes a plurality of pixels. The pixel includes a photodiode, a drive device for driving the interested photodiode, and other devices. The pixels correspond to the photodiodes one-to-one, and the ratio of the light receiving area of the photodiode to the image sensor surface area per pixel is referred to as the "fill factor." The fill factor of a common image sensor is about 20%. Therefore, the fill factor is a standard for photosensitivity of the image sensor.

In order to improve the photosensitivity of the image sensor in the restricted space, it is necessary to increase the number of pixels to be integrated, and it is necessary to expand the light receiving area of the photodiode occupying the pixel to the largest possible extent.

A proposed measure for increasing the fill factor of the sensor involves locating, for each pixel, a micro lens at a position corresponding to the light receiving area to collect light onto the photodiode.

However, light not received by the photodiodes through the micro lenses may cause cross talk. This interference between unnecessary light beams blurs colors in the image sensor.

SUMMARY OF THE INVENTION

The present invention has been made to solve the above-mentioned problems contained in the prior art, and, in one aspect, features an image sensor capable of reducing cross talk.

The image sensor includes a substrate having an epitaxial layer grown on the substrate, and a plurality of photodiodes buried in the epitaxial layer. Field oxide films are interposed between the photodiodes for insulating the photodiodes. Each of the field oxide films includes a trench formed on the epitaxial layer, a first oxide layer deposited on an inside of the trench, a reflective layer deposited on the first oxide film for reflecting incident light toward a side of the photodiode, and a second oxide layer formed on the reflective layer.

BRIEF DESCRIPTION OF THE DRAWINGS

The above and other aspects, features and advantages of the present invention will be more apparent from the following detailed description taken in conjunction with the accompanying drawings.

It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION

Hereinafter, an embodiment of the present invention is described with reference to the accompanying drawings. For the purposes of clarity and simplicity, the following discussion omits detailed description of known functions and configurations incorporated herein.

Figure 1:
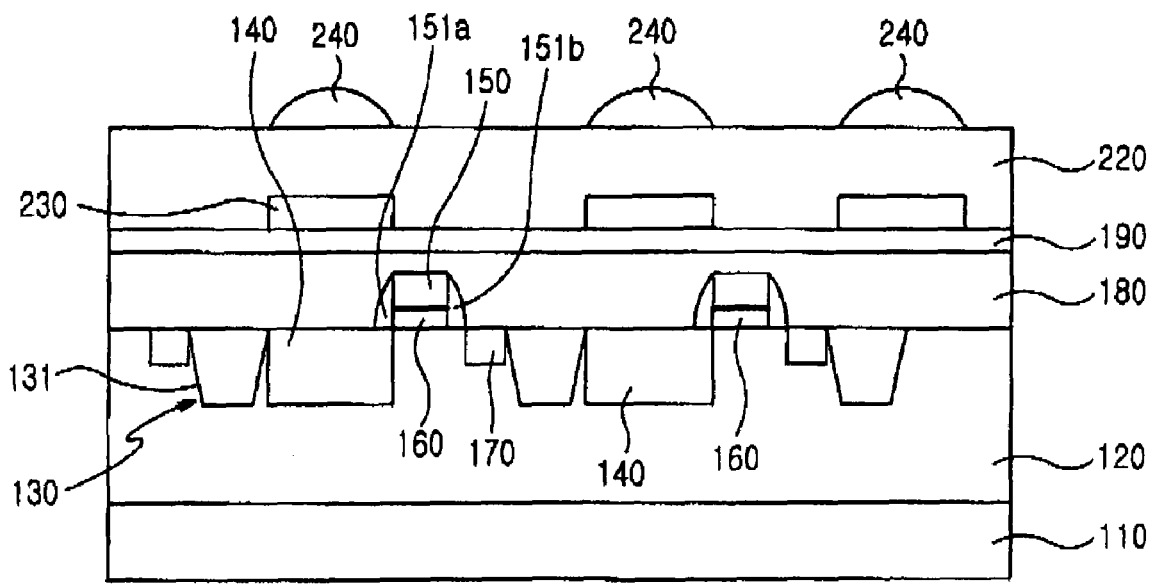
FIG. 1 is a side view of an image sensor according to a preferred embodiment of the present invention.

Referring now in specific detail to the drawings in which like reference numerals identify similar or identical elements throughout the several views, and initially to FIG. 1, an image sensor according to the present invention includes a substrate 110 with an epitaxial layer 120 deposited thereon and a plurality of photodiodes 140 buried in mutual adjacency within the epitaxial layer. The substrate 110 is doped with p-type dopants. The overlying epitaxial layer 120 is likewise doped with p-type dopants, but at a lower concentration. A plurality of field oxide films 130 are interposed between the photodiodes 140 The image sensor has a plurality of transfer gates 150, and gate oxide films 160 each of which is disposed between one of the transfer gates and the epitaxial layer 120. Deposited on the epitaxial layer 120 is a first insulation layer 180. A plurality of color filters 230 are disposed on the first insulation layer 180 in respective opposition to the corresponding photodiode 140. A second insulation layer 190 is deposited on the first insulation layer 180. A plurality of lenses 240 are formed on the second insulation layer 190 and are respectively disposed in opposition to the corresponding color filter 230.

Figure 2:
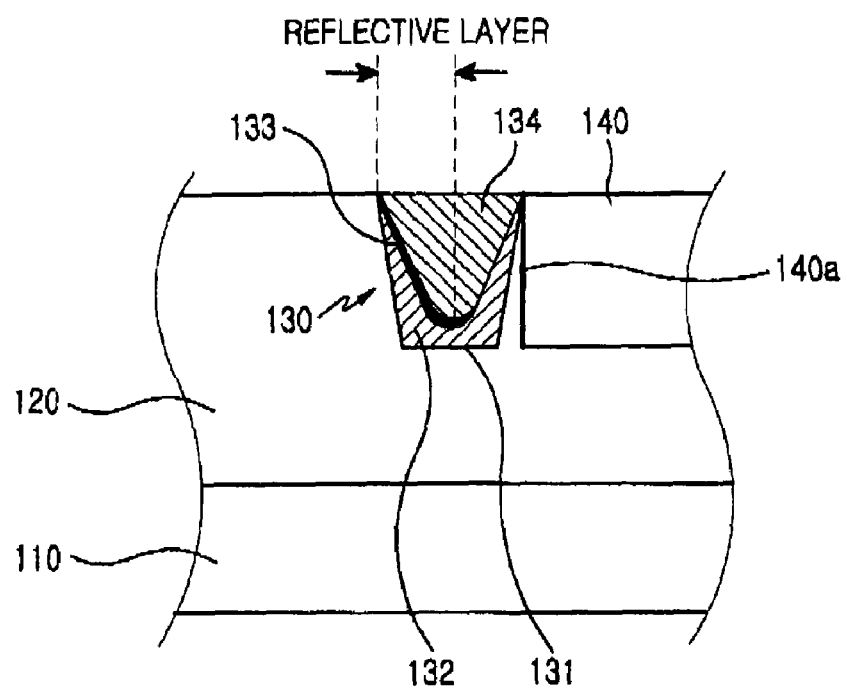
FIG. 2 is a side view of the field oxide film in FIG. 1.
Figure 3A:
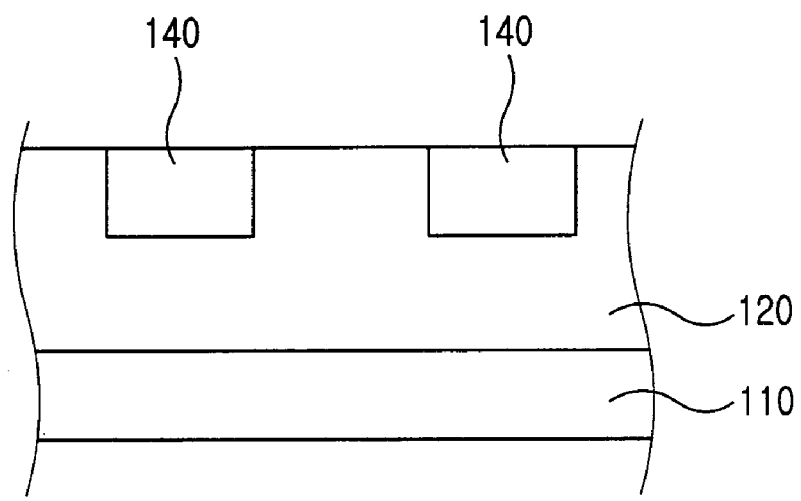
FIGS. 3A through 3E are views progressively illustrating a process of manufacturing the field oxide film in FIG. 1.
Figure 3B:
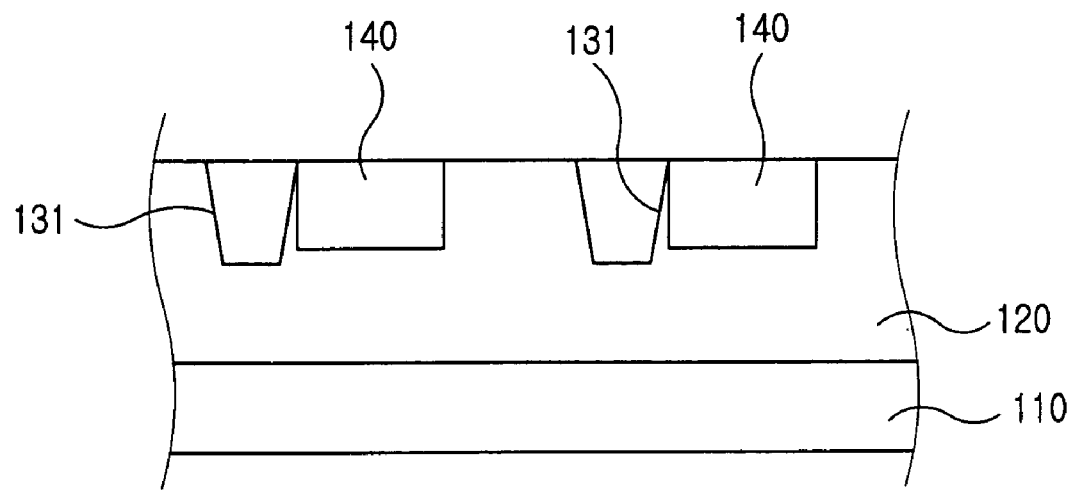
Figure 3C:
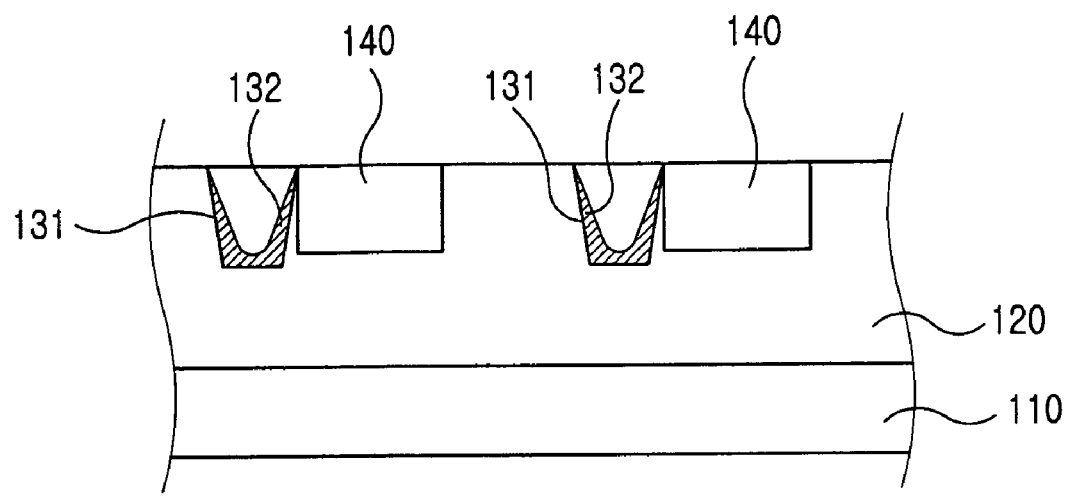
Figure 3D:
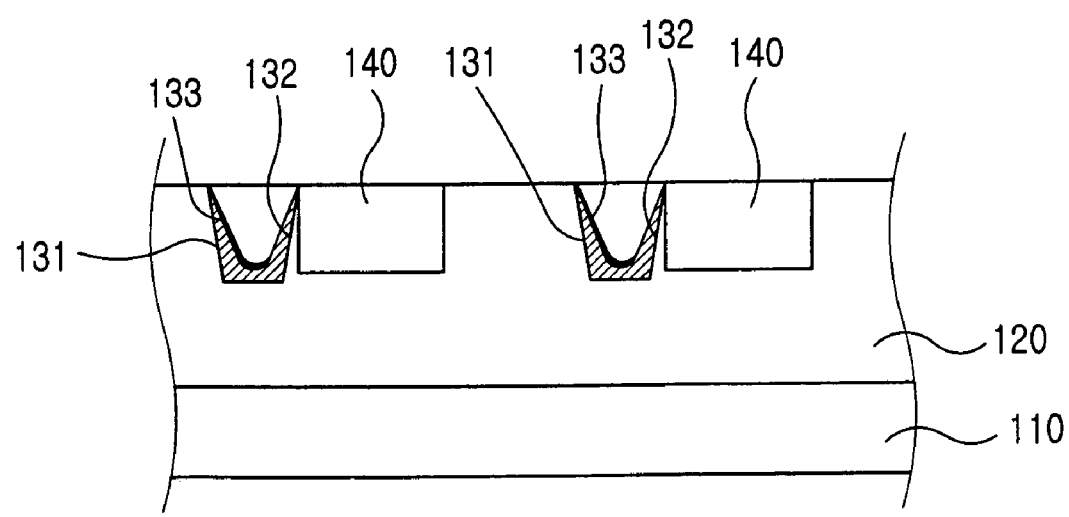
Figure 3E:
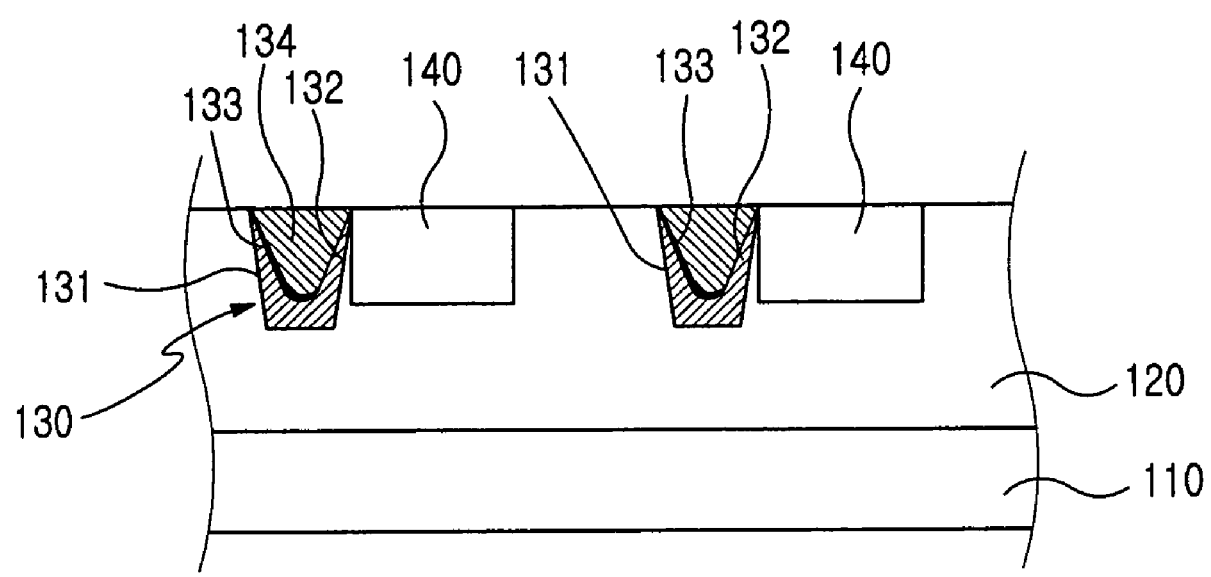

As shown in FIG. 2, the field oxide film 130 of FIG. 1 includes a trench 131 formed on the epitaxial layer 120, a first oxide layer 132 deposited on the trench, a reflective layer 133 deposited on the first oxide film for reflecting incident light to a side 140a of each photodiode 140, and a second oxide layer 134 formed on the reflective layer.

The first oxide layer 132 is deposited with liquid oxide on the bottom surface and the side surface of the trench 131 through spin coating, so that it has a predetermined inclination with respect to the side of the photodiode 140.

The reflective layer 133 is deposited on a portion of the first oxide layer 132 opposite to the side 140a of the photodiode 140, so that the incident light is reflected to that side of the photodiode. The reflective layer 133 is formed through metal coating or sputter coating. The second oxide layer 134 is deposited on the first oxide layer 132 with the reflective layer 133 formed thereon.

The field oxide film 130 is formed by flattening the deposited second oxide layer 134. The field oxide film 130 insulates the photodiodes 140 optically and electrically. In particular, the reflective layer 133 reflects the light which is not incident upon a light receiving surface of the photodiode to the side 140a of the respective photodiode 140, thereby improving light receiving capability of the photodiode.

The transfer gate 150 is formed on the epitaxial layer 120, and spacers 151a, 151b are disposed at both walls of the transfer gate 150. The gate oxide film 160 is deposited as insulation between the transfer gate 150 and the epitaxial layer 120.

The first insulation layer 180 is deposited on the epitaxial layer 120 including the transfer gates 150, and the second insulation layer 190 is deposited on the first insulation layer.

Each of the micro lenses 240 is formed in alignment with the corresponding color filter 230. The micro lenses 240 direct the incident light to converge onto the light receiving surface of the photodiode 140 while passing through the respective color filter 230.

According to the present invention, a reflective layer is deposited asymmetrically in the field oxide film such that its outer surface faces a side of the photodiode so as to reflect incident light to that side. Therefore, the light is not reflected so as to interfere with other light incident upon a light receiving surface of a photodiode. As a result, the light receiving ability of the image sensor can be improved without increasing fill factor of the photodiode, and without the shortcomings associated with the use of micro lenses. In short, the present invention can improve photosensitivity of the image sensor without increasing the light receiving area of the photodiode and without the disadvantage of color blurring or disturbance such as cross talk associated with the prior art use of micro lenses.

While the invention has been shown and described with reference to a preferred embodiment thereof, it will be understood by those skilled in the art that various changes in form and details may be made therein without departing from the spirit and scope of the invention as defined by the appended claims.

What is claimed is:

1. An image sensor comprising:
   a substrate;
   an epitaxial layer being disposed on the substrate;
   a plurality of photodiodes being disposed within the epitaxial layer; and
   a plurality of field oxide films being interposed between the photodiodes and being configured to insulate the photodiodes,
   at least one field oxide film of the plurality of field oxide films including a trench that is disposed on the epitaxial layer; a first oxide layer being contained within the trench; a reflective layer being contained within the trench, adjoining the first oxide film, and being configured to reflect incident light toward one of the photodiodes; and a second oxide layer being contained within the trench and adjoining the first oxide layer and the reflective layer.

2. The image sensor as claimed in claim 1, further comprising
   a plurality of transfer gates, each having two walls, said transfer gates being formed on the epitaxial layer, said epitaxial layer having spacers, said spacers being disposed at said two walls of the each transfer gates;
   a gate oxide film being interposed between the transfer gate and the epitaxial layer;
   a first insulation layer being disposed on the epitaxial layer, the first insulation layer including the transfer gates;
   a plurality of color filters, each color fliter being disposed opposite to one of said plurality of photodiodes;
   a second insulation layer deposited on the first insulation layer; and
   a plurality of micro lenses, each micro lens being disposed opposite to one of the plurality of color filters.

3. The image sensor of claim 2, wherein each color filter is being aligned with one of said plurality of photodiodes.

4. The image sensor of claim 3, wherein each micro lens is being aligned with one of the plurality of color filters.

5. The image sensor of claim 2, wherein each micro lens is being aligned with one of the plurality of color filters.

6. The image sensor as claimed in claim 1, wherein the first oxide layer comprises first and second inclined surfaces and an upper surface, wherein the second oxide layer comprises third and fourth inclined surfaces and a lower surface, and wherein the reflective layer is interposed between the first and third inclined surfaces and between the upper and lower surfaces.

7. The image sensor as claimed in claim 6, wherein the reflective layer is in a direct contact with the first and third inclined surfaces, and with the upper and the lower surfaces.

8. The image sensor as claimed in claim 7, wherein the second and third inclined surfaces are in a direct contact with one another.

9. The image sensor as claimed in claim 6, wherein the second and third inclined surfaces are in a direct contact with one another.

10. The image sensor as claimcd in claim 1, wherein the first oxide layer comprises a first boundary contained within the trench; wherein the second oxide layer comprises a second boundary contained within the trench; and wherein the reflective layer is being interposed between the first and second boundaries.

11. The image sensor as claimed in claim 10, wherein the reflective layer is in direct contact with a portion of the first boundary and a portion of the second boundary.

12. The image sensor as claimed in claim 1, wherein the substrate is a p-type substrate.

13. The image sensor as claimed in claim 1, wherein the epitaxial layer and the substrate are each p-type, wherein the epitaxial layer has less dopant concentration than the substrate.

14. The image sensor as claimed in claim 1, wherein the first oxide layer is being configured within the trench in a manner consistent with deposition.

15. The image sensor as claimed in claim 1, wherein the first oxide layer has an external surface disposed away from a surface of the trench, and the reflective layer is disposed on a portion of said external surface.

16. The image sensor of claim 1, wherein each of said plurality of field oxide films includes said trench, said first oxide layer, said reflective layer associated with one of the plurality of photodiodes, and said second oxide layer.

17. The image sensor as claimed in claim 1, wherein the reflective layer is interposed between a portion of a first boundary of the first oxide layer and a portion of a second boundary of the second oxide layer.

18. The image sensor as claimed in claim 1, wherein the first oxide layer is deposited on a surface of the trench, wherein the reflective layer is deposited on a portion of a surface of the first oxide layer, and wherein the second oxide layer is deposited on a surface of the reflective layer and the surface of the first oxide layer.

* * * * *